United States Patent [19]

Okumura

[11] 4,059,443
[45] Nov. 22, 1977

[54] ELECTRICAL INFORMATION STORAGE SYSTEM
[75] Inventor: Koji Okumura, Penfield, N.Y.
[73] Assignee: Xerox Corporation, Stamford, Conn.
[21] Appl. No.: 539,913
[22] Filed: Jan. 9, 1975
[51] Int. Cl.² .............................................. G03G 5/02
[52] U.S. Cl. ........................... 96/1 PS; 96/1.5 R; 340/173 PP; 346/153; 346/160; 365/147
[58] Field of Search ................... 96/1 S, 1 PS, 1; 252/500; 427/74, 75; 340/173 PP; 346/74 ES, 74 P

[56] References Cited
U.S. PATENT DOCUMENTS
3,350,610  10/1967  Yamashita ................. 340/173 PP Primary Examiner—John D. Welsh
Attorney, Agent, or Firm—James J. Ralabate; Richard A. Tomlin; Max J. Kenemore

[57] ABSTRACT

An electrical information or latent image storage system using a storage element which comprises a layer of substantially electrically insulating material having a layer of electrically photosensitive particulate material embedded therein, with a layer of semiconductor material overcoating one surface of the layer of insulating material, and an electrode on the opposite surface of the layer of insulating material. Information in the form of localized electrical charges of an electrical latent image is placed on the element by electrical or photo-electrical means, the information can be retrieved by scanning the element using an electrode-pair grid pattern, an electron beam, or other suitable means, and the retrieved information may be used, for example, through a computer, or reconstructed into a visible image corresponding to a latent image.

10 Claims, 14 Drawing Figures

ELECTRICAL INFORMATION STORAGE SYSTEM

This invention relates generally to systems for storing and retrieving information, and more specifically for systems for storing and retrieving electrical information or electrical latent images.

A variety of information storage and retrieval systems are known and now in use. For example, digital computers store and retrieve binary information from storage register memories, or magnetic core memories. Analog computers store and retrieve information in the form of varying voltage levels. Information is also stored and retrieved in various magnetic tape or magnetic card storage and retrieval systems. In addition to the foregoing electrical and magnetic systems, more familiar forms of information storage and retrieval systems include printed paper, film, and microfilm, all of which may have information stored therein by any of a variety of mechanical, chemical, photochemical, or photoelectrical means.

A recently developed example of an electrically or photoelectrically addressable microfilm system is a migration imaging system capable of producing high quality images of high density, continuous tone, and high resolution. Such a migration imaging system is disclosed, for example, in Goffe U.S. Pat. Nos. 3,520,681, 3,801,314, and in copending application Ser. No. 837,591, filed June 30, 1969. In a typical embodiment of this migration imaging system, an imaging member which comprises a substrate, a layer of softenable material, and a layer of photosensitive marking material, is electrically latently imaged by electrically charging the member, and exposing the charged member to a pattern of activating electromagnetic radiation, such as light. Where the photosensitive marking material was originally in the form of a layer thereof contiguous the upper surface of the softenable layer, marking particles in the exposed areas of the member typically migrate toward the substrate when the member is developed by softening the softenable layer.

There have also been found methods for capturing or setting an electrical latent image provided in imaging members such as those used in the aforementioned migration imaging system, either by storing the latently imaged member in the dark, or by applying heat, vapor, or partial solvents, in a partial softening step to thereby capture or set the electrical latent image. Such image setting systems are disclosed, for example, in copending applications Ser. Nos. 349,585; 349,506; and 349,505; all filed Apr. 9, 1973.

Despite the technical progress in information storage and retrieval, and particularly in electrically generated information storage and retrieval systems as inciated above, there is still a need for improved and more economical systems for storing and retrieving electrical information and electrical latent images. For example, the memory systems used in digital computer applications are typically expensive components often requiring a great deal of microcircuitry which requires much use and reuse in order to make such units economically feasible. While magnetic tape or card systems are typically used for voice recording, recording of typewritten information, and recording of digital information, these magnetic systems are typically not used for storing and retrieving photographic-type imaged information. In the advantageous migration imaging system described above, while certain methods preserving latent images are known, there continues to be a need for increasing the ability to store such electrical latent images, and to date no really satisfactory method of reading out electrical latent images in such migration imaging members, without physcially developing the latent images into visible images on the same member, has been realized.

As mentioned above, the present known systems for storing photographic images which are readily retrievable by electronic means, tend to be very expensive. Because a very large number of individual bits of information are required for storing a reasonably good quality image, and because of the need to assign certain tonal contrast information to each bit, the only practical presently known way to electronically store such information is on magnetic tape, which provides a large area in which to store such large quantities of information. Photographic film and printed paper are much more efficient mediums which to store optical images, particularly with respect to capacity (quantity of information per unit area ) and tonal fidelity. But photographic images on paper or film are quite awkward to electronically retrieve. While electro-optic devices have been developed for such applications, these devices which provide on interface between the optical image and corresponding electronic signals typically degrade the quality of the optical image information. The present invention provides a new form of photographic image storage system which combines the advantages of optical image storage in photographic film or paper, with the simple, fast retrieval capabilities of media like magnetic tape.

BRIEF SUMMARY OF THE INVENTION

It is, therefore, an object of this invention to provide an electrical information storage and retrieval system which overcomes the above-noted disadvantages and fulfills the aforementioned needs.

It is another object of this invention to provide novel electrical information storage members.

It is another object of this invention to provide an electrical information and storage member from which the electrical information may be retrieved, without physically changing the make-up of the storage member or visibly indicating the information on the storage member.

It is another object of this invention to provide a system and member for permanent storage of electrical information and electrical latent images in typical room environments.

It is another object of this invention to provide a novel system for storing and retrieving electrical information and electrical latent images.

It is another object of this invention to provide a system wherein additional electrical information may be added to that already on an electrical information storage member.

It is a further object of this invention to provide a system for quickly reading out electrical information from an electrical information storage member.

It is still another object of this invention to provide an economical electrical information storage member which may be used in relatively temporary applications after which it is disposable.

The foregoing objects and others are accomplished in accordance with the present invention which is an electrical information or latent image storage system using a storage element comprising a layer of substantially electrically insulating material having a layer of electrically photosensitive particulate material embedded therein, with a layer of semiconductor material overocating one surface of the layer of insulating material, and an electrode on the opposite surface of the layer of insulating material. Information in the form of localized electrical charges or an electrical latent image is placed on the element by electrical or photo-electrical means. That information can be retrieved by scanning the element using an electrode-pair grid pattern, an electron beam, or any other suitable means. The retrieved information may then be used, for example in further computer applications or reconstructed into a visible image corresponding to any latent image.

BRIEF DESCRIPTION OF THE DRAWINGS

For a better understanding of the invention as well as other objects and further features thereof, reference is made to the following detailed disclosure of preferred embodiments of the invention taken in conjunction with the accompanying drawings thereof, wherein.

DETAILED DESCRIPTION OF THE PREFERRED EMBODIMENTS

Figure 1:
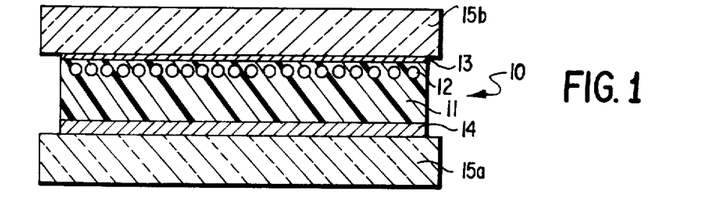
FIG. 1 is a partially schematic, cross-sectional view of the advantageous electrical information storage members of the present invention.

The advantageous electrical information storage members of the present invention are illustrated in FIG. 1, where member 10 comprises a layer of substantially electrically insulating material 11 containing a layer of electrically photosensitive particulate material 12, with a layer of conductive electrode material 13 in contact with one surface of the layer of electrically insulating material 11, and a layer of semiconductor material 14 in contact with the opposite surface of the layer of insulating material 11. The electrical information storage member of the present invention, primarily comprises the insulating layer 11, photosensitive material 12 and semiconductor layer 14, and those elements are usually accompanied by electrode 13. The storage member 10 may, and typically will be supported by a substrate 15a or 15b. In FIG. 1, substrate 15a is shown supporting the member with the semiconductor layer 14 in contact with the substrate 15a, while an alternative embodiment may comprise the conductive electrode material 13 of member 10 in contact with a substrate 15b. In various embodiments, one or both of the substrates 15a and/or 15b may be used in conjunction with the storage member 10. As shown in FIG. 1, the layer of electrically photosensitive particulate material 12, preferably is in the form of a monolayer spaced apart from both the top surface of layer of electrically insulating material 11 and from the layer of semiconductor material 14. However, layers of electrically photosensitive particulate material which are more than one particle diameter in thickness may also be used.

Figure 2:
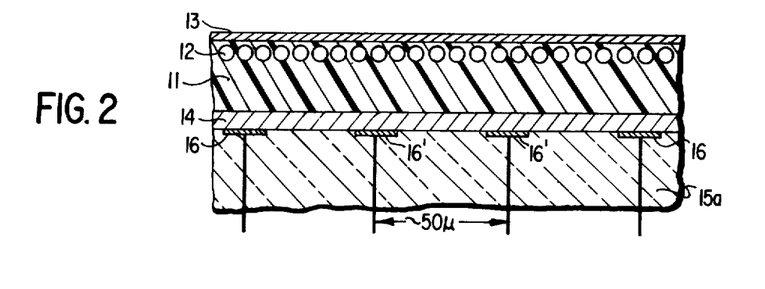
FIG. 2 is a partially schematic, cross-sectional view of an embodiment of the advantageous electrical information storage members of the present invention including a plurality of electrode pairs for use in addressing and/or reading out information from the member.

One preferred form of the system of the present invention is illustrated in FIG. 2 wherein electrical information storage member 10 is shown supported by substrate 15a, and at the surface of substrate 15a which is in contact with the semiconductor layer 14, a plurality of laterally spaced electrodes 16 are in contact with the semiconductor layer 14. In the present invention the electrodes 16 are organized into a series or grid of electrode pairs, which at least partially surround discrete small areas of the total area of the electrical information storage member. Each of these discrete small areas may be considered to be a repository where a single bit of information may be stored in the storage member of the present invention. The distance between electrodes of a single electrode pair, for example between electrode pair 16' of FIG. 2, is quite small, and, for example, in the present invention may be on the order of approximately 2 mils or 50 microns, as illustrated in FIG. 2. It will thus be appreciated that an extremely large number of bits of information can be stored in a relatively small overall area of the advantageous electrical image storage members of the present invention.

Figure 3A:
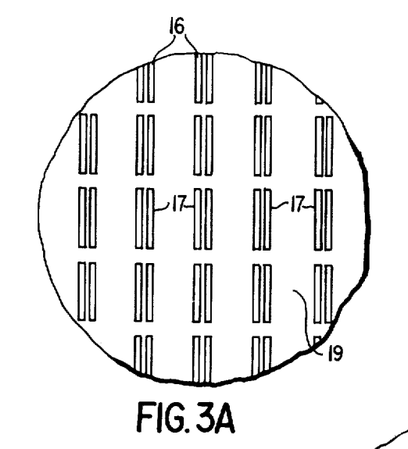
FIGS. 3A, 3B, and 3C are partially schematic, magnified area views of the surface of the member of FIG. 2 showing various configurations of the electrode pairs.
Figure 3B:
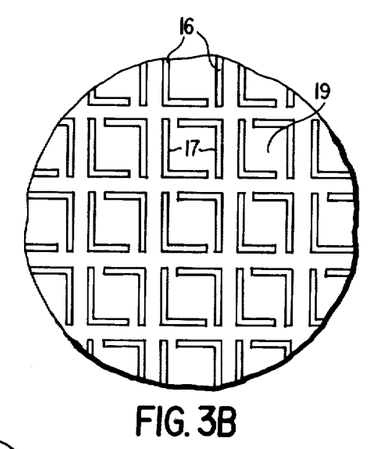
Figure 3C:
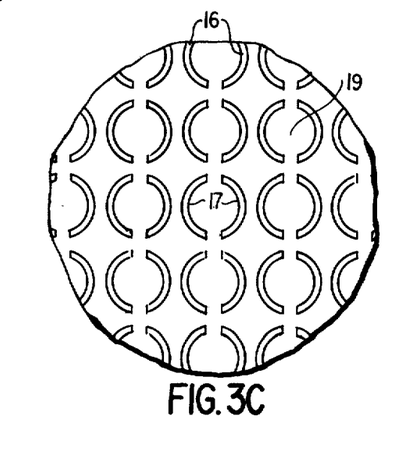

The grid pattern in which the pairs of electrodes 16 appear in the system of FIG. 2 is perhaps more clearly illustrated in the representative area views of FIGS. 3A-3C, which schematically illustrate various preferred embodiments of area grids in which said electrode pairs may be used. For example, in FIG. 3A, electrode pairs 17 are shown in the form of two spaced line electrodes having an open, substantially rectangular area 19 therebetween. It is the area approximately defined by the electrode pairs 17 and the space therebetween 19, which is an individual bit of storage of information on the surface of the storage member. As shown in FIG. 3A, adjacent rows of electrode pairs 16 appear in a grid-like pattern to thereby provide a large number of information bits throughout the surface of the storage member.

In FIG. 3B the electrodes 16 which form electrode pairs 17 are each in an L-shaped configuration, with the two L-shaped electrodes of each pair inverted with respect to each other thereby defining approximately rectangular area 19 which is almost entirely surrounded by the electrodes 16 which form each of the electrode pairs 17. As will be more clearly appreciated after reviewing the subsequent description of the operation of these electrode pairs, these mutually inverted L-shaped pairs which almost entirely surround the area 19, provide an electron pair system which is preferable to that shown in FIG. 3A, because there is greater liklihood that any information stored within an individual bit, as illustrated in FIG. 3B, will show response upon scanning of the individual bits for retrieval of any information on the storage member.

FIG. 3C shows a still further embodiment of the grid of electrodes 16 forming electrode pairs 17 which enclose bit-areas 19. Like the mutually inverted L-shaped electrode pairs illustrated in FIG. 3B, the concavely facing crescent or semicircular electrodes 16 of the electrode pairs 17 illustrated in FIG. 3C almost completely enclose the bit-areas 19, thereby providing an effect similar to that provided by the electrode pair grid arrangement illustrated in FIG. 3B. It will be appreciated that the systems of FIG. 3B and 3C also minimize edge effects or electrode end effects which would be more pronounced at the ends of the parallel spaced electrodes in the pairs 17 illustrated in FIG. 3A.

Figure 8:
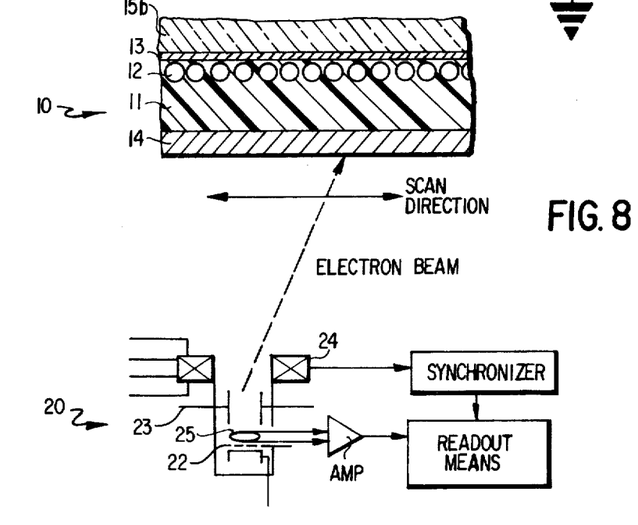
FIG. 8 is a partially schematic, cross-sectional view of another preferred embodiment of the advantageous electrical information storage members of the present invention, additionally schematically illustrating another preferred system for retrieving information from the information storage member.

Another preferred embodiment of the electrical information storage members of the present invention is illustrated in FIG. 8 wherein storage member 10 is supported on substrate 15b which is in contact with electrode layer 13 at the opposite side of the member 10 from the semiconductor layer 14. It will be appreciated that the member illustrated in FIG. 8 is the same as the member illustrated in FIG. 1 absent substrate 15a, while the member illustrated in FIG. 2 is similar to the member illustrated in FIG. 1 absent substrate 15b.

Materials suitable for use as substantially electrically insulating layer 11 in the electrical information storage members of the present invention include the materials disclosed for use as softenable substantially electrically insulating material in U.S. Pat. No. 3,801,314, copending application Ser. No. 27,890, filed Apr. 13, 1970; as well as the materials suitable for use as a solvent soluble electrically insulating layer in U.S. Pat. No. 3,520,681; and the disclosures of those patents and application, respectively, are hereby expressly incorporated by reference herein. A particularly preferred material for use as the substantially electrical insulating material of layer 11 is a custom synthesized 80/20 mole% copolymer of styrene and hexylmethacrylate having an intrinsic viscosity of about 0.179 dl/gm (when measured in toluene). The layer of substantially electrically insulating material 11 may be of any desired thickness, so long as the layer of electrically photosensitive material 12 is fully embedded therein. Insulating layer thicknesses of up to about 4 microns are preferred, with insulating layer thicknesses of about 0.5 to about 2 microns being particularly preferred.

Materials suitable for use as the electrically photensensitive particulate material 12 in the electrical information storage members of the present invention also include the photosensitive materials disclosed in the aforementioned U.S. Pat. Nos. 3,520,681 and 3,801,314. A particularly preferred electrically photosensitive material is selenium or a selenium alloy with arsenic, tellurium, antimony, thallium, bismuth, or mixtures thereof, such as arsenic triselenide, as well as other materials include substantially pure amorphous selenium, which may include substantially pure amorphous selenium or amorphous selenium alloys doped with materials such as halogens. Other suitable electrically photosensitive materials include phthalocyanines such as X-form metal-free phthalocyanine or Monolite Fast Blue GS, the alpha form of metal-free phthalocyanine, C.I. No. 74100, available from Arnold Hoffman Co;, Algol Yellow G.C. 1,2,5,6-di (c,c'-diphenyl)-thiazole-anthroquinone, C.I. No. 67300, available from General Dyestuffs; Light Cadmium Orange Concentrate, a cadmium selenide pigment, C.I. No. 77196, available from Imperial Color and Chemical Co.; Indofast Brilliant Scarlet Toner, 3,4,9,10-bis[N,N'-(p-methoxyphenyl)-imido]-perylene, C.I. No. 71140, available from Harmon Colors; Watchung Red B, a barium salt of 1-(4'-methyl-5'-chloroazobenzene-2'-sulfonic acid)-2-hydroxy-3-naphthoic acid, C.I. No. 15865, available from duPont; as well as mixtures thereof, or composite particles containing more than one electrically photosensitive material is a binder of polyvinyl alcohol, polyvinyl chloride, polyethylene, polyvinyl carbazole or other suitable material. The term "electrically photosensitive" as used herein means materials which show increased electrical conductivity when illuminated with electromagnetic radiation, which includes materials which apparently allow selective relocation, of charge into, within, or out thereof, said relocation being affected by the action of light on the bulk or surface of the electrically photosensitive materials when said material is exposed to activating electromagnetic radiation such as light. These effects may include photoconductive affects, photoinjection, photoemission, photochemical effects, and others which cause the aforementioned selective relocation of charge.

In preferred embodiments of the electrical information storage members of the present invention, the layer of electrically photosensitive particulate material 12 will comprise a mono-layer of particles substantially uniformly distributed throughout the surface area of the layer of the substantially insulating material 11, with substantially all of the particles of electrically photosensitive material fully embedded in, or surrounded by, electrically insulating material 11. A preferred way for preparing such a layer of electrically photosensitive material in a layer of substantially electrically insulating material, is the vacuum evaporation vapor deposition technique disclosed in Goffe et al. U.S. Pat. No. 3,598,644, which is hereby expressly incorporated by reference herein. When one of these techniques is used with a preferred material, such as selenium, a layer of particles of size generally less than about 1 micron, but within the range from about 0.01 to about 2.0 microns is produced, and those particles are substantially entirely embedded within the upper surface of a layer of electrically insulating material when preferred electrically insulating materials are used.

The electrode 13 may in various embodiments comprise any suitable material, but preferably comprises a material which is substantially transparent to activating electromagnetic radiation which activates the electrically photosensitive particulate material 12. While the electrode 13 may be applied directly onto the surface of substantially insulating material layer 11, as shown for example, in FIG. 2, the electrode material 13 is more typically applied upon the surface of another substrate, for example such a substrate 15b as shown in FIG. 1 and FIG. 8. The electrode may be any suitably transparent continuous conductive coating including, for example, coatings of tin, indium oxide, aluminum, chromium, tin oxide, or any other suitable conductor. Such substantially transparent conductive coatings may be applied, for example, by evaporation or any other means onto either the surface of the substantially insulating material 11, or the surface of a substrate 15b. Where the electrode comprises a substantially transparent conductive layer on a substrate, NESA glass, a tin oxide coated glass manufactured by the Pittsburgh Plate Glass Company, is a commercially available example of a suitable transparent conductive electrode material. Another such example is aluminized Mylar, a polyester film available from duPont, overcoated with a thin aluminum layer which is about 50% visible light transmissive. The substrate 15a or 15b, may comprise any suitable material, but is preferably substantially electrically insulating materials, such as glass or plastic. A number of such substrates are disclosed in the aforementioned U.S. Pat. Nos. 3,520,681, and 3,801,314. In various embodiments, the substrates, and the electrical information storage members of the present invention may be used in any suitable form, including a web, foil, laminate, strip, sheet, coil, cylinder, drum, endless belt, endless mobius strip, circular disc, or the like.

The semiconductor layer 14 may comprise any suitable semiconductor material having a resistivity of at least a few hundred ohm-cm. More specifically, semiconductor materials having a resistivity in the range of about 500 ohm-cm to about 2000 ohm-cm. are preferred. Relatively wide band-gap semiconductors may be used. Examples of suitable materials include pure silicon, doped silicons, compounds of elements from Periodic Table Groups II and VI such as the oxides, sulfides or selenides of zinc and cadmium, compounds of elements from Periodic Table Groups III and V such as the arsenides or antimonides of gallium or indium, and others, these materials intended to be exemplary and not limiting. The layer of semiconductor material 14 may be of any suitable thickness, with layers of thicknesses on the order of about 0.1 micron, for example layers in the range of about 3000 Angstroms (0.03 microns) to about 1 micron being particularly preferred. Such semiconductor layers may be provided by any of the well known semiconductor coating means, including the method wherein the semiconductor is vacuum evaporated onto a desired surface in a vacuum chamber wherein an electron beam impinges upon a source of the semiconductor which is evaporated and subsequently deposited.

The small electrodes 16 which form the electrode pairs 16' and 17 shown in FIGS. 2 and 3A-3C, may be produced by any suitable means, but well known microprinting techniques are preferred wherein microscopic electrodes of metallic material or metallic inks are provided on the surface of a substrate, for example like substrate 15a shown in FIG. 2. Currently available microprinting techniques are capable of providing such printed electrodes, or printed circuitry, in such small sizes that a few hundred line pairs per millimeter may be distinctly printed.

From all of the foregoing it will therefore be appreciated that an electrical information storage member such as that illustrated in FIG. 2 can be produced by providing a substrate 15a, microprinting the desired electrodes or electrode pairs 16 and 16' thereon, overcoating the electroded substrate with a semiconductor layer 14, over which layer of substantially electrically insulating material 11 is coated into which layer of electrically photosensitive material 12 is embedded, and the member is completed by the addition of electrode 13 at the upper surface of substantially insulating layer 11.

Similarly, the advantageous electrical information storage members as illustrated in FIG. 8 may be provided by first coating a layer of substantially electrically insulating material 11 on a temporary substrate and then embedding the layer of electrically photosensitive material 12 therein by one of the techniques discussed above herein, whereafter the layer of substantially electrically insulating material 11 containing the layer of electrically photosensitive material 12 is transferred to an electroded substrate 15b having a conductor layer 13 thereon by a contact transfer technique. For example a technique such as that disclosed in Jones et al. U.S. Pat. No. 3,770,554, the disclosure of which is hereby expressly incorporated by reference herein, may be used. The member is then completed by overcoating the remaining exposed surface of the layer of substantially insulating material 11 with a semiconductor layer 14.

Figure 4A:
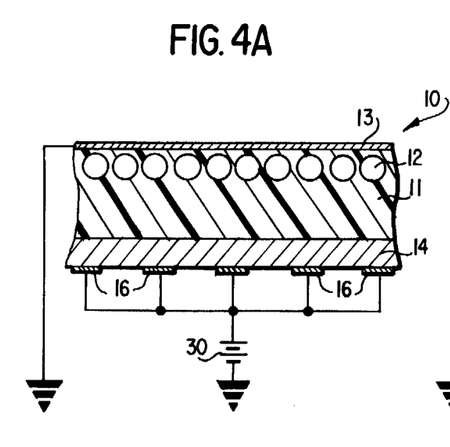
FIGS. 4A-4C are partially schematic, cross-sectional views of the electrical information storage member of FIG. 2, showing steps including selectively exposing portions of the member with activating electromagnetic radiation to create an electrical latent image in the member.
Figure 4B:
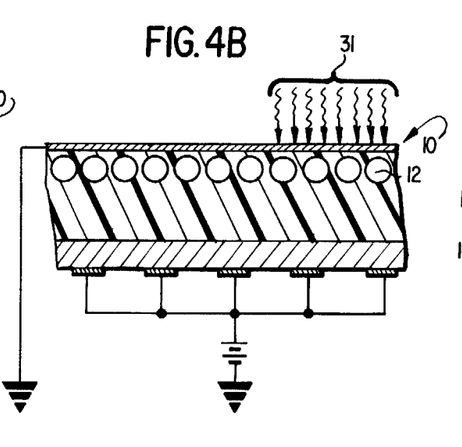
Figure 4C:
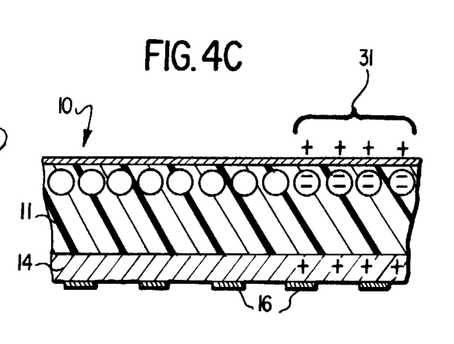

Before discussing how the electrical information storage members of the present invention are believed to theoretically operate, it is useful to discuss how electrical information is initially recorded in such an electrical information storage member. In one mode, as illustrated in FIGS. 4A-4C, the member is electrically charged by connecting all of the electrodes 16 to one side of a potential source 30, connecting the electrode layer 13 to ground or the opposite pole of the source of potential (FIG. 4A), thereby creating a potential difference across the substantially electrically insulating layer 11, and then imagewise exposing (FIG. 4B) the layer of electrically photosensitive material 12 so that the electrically photosensitive particles 12 in areas exposed with activating the electromagnetic radiation 31 undergo their electrically photosensitive effect, forming an electrical latent image (FIG. 4C) in the electrical information storage member of the present invention. In this method electrical information is stored in those areas which are imagewise exposed with activating electromagnetic radiation, and that electrical information is in the form of an electrical latent image corresponding to the imagewise exposure. This method of latently imaging such a member is described in more detail in U.S. patent application Ser. No. 327, filed Jan. 2, 1970, now abandoned.

Figure 6A:
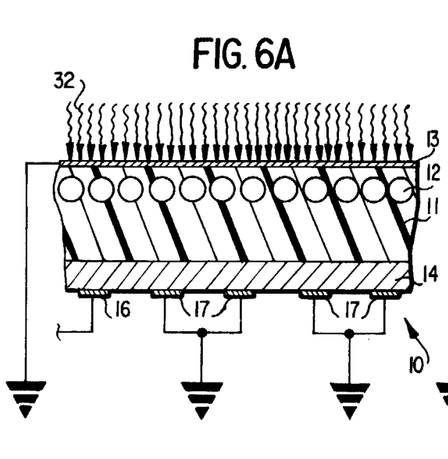
FIGS. 6A-6C are partially schematic, cross-sectional views of the electrical information storage member of FIG. 2, showing steps including selectively electrically addressing the member while it is uniformly exposed with activating electromagnetic radiation to create an electrical latent image in the member.
Figure 6B:
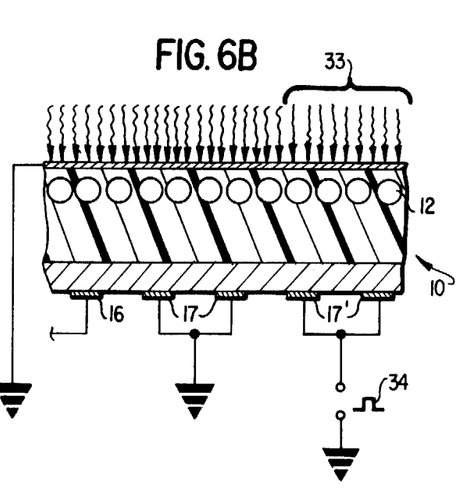
Figure 6C:
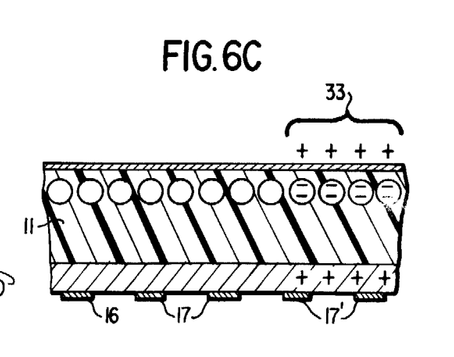

Another method of storing electrical information in the storage member of the present invention is a method wherein electrical information is selectively placed in the storage member through an address system using the microelectrodes 16 which form electrode pairs 17. In this mode as illustrated in FIGS. 6A-6C, overall electrode 13 is grounded or biased to a potential of sign opposite to that to be applied to selective electrode pairs 17, and the storage member is substantially uniformly irradiated with activating electromagnetic radiation 32, as shown in FIG. 6A. Then, as shown in FIG. 6B, an electrical voltage pulse 34 is applied to an electrode pair 17' thereby creating an electrical field across the entire thickness of the storage member 10. The presence of an electrical field across the entire thickness of the storage member 10, as well as the presence of activating electromagnetic radiation 32, allows the electrically photosensitive material 12 in areas 33 where such fields are present to undergo its electrically photosensitive effect thereby storing information, again in the form of an electrical latent image, corresponding to the electrical voltage applied to the addressed electrode pair 17' in area 33. The resultant stored information or electrical latent image is schematically illustrated as charges trapped in area 33 of FIG. 6C, when the electrical circuitry is disconnected.

Figures 5, 7:
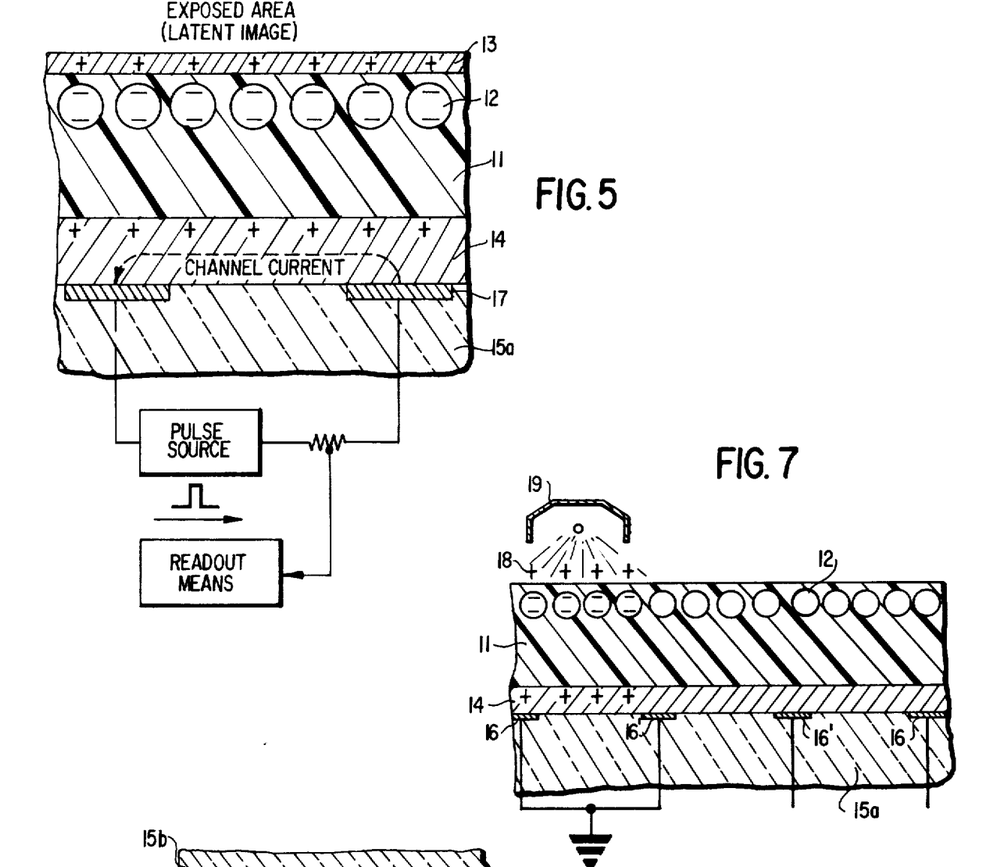
FIG. 5 is a partially schematic, cross-sectional view of a member like that illustrated in FIG. 2 further schematically illustrating a system for retrieving electrical information from an area of the member wherein such information is stored.
FIG. 7 is a partially schematic, cross-sectional view of another preferred embodiment of the electrical information storage members of the present invention.

The theoretical operation of the information storage members illustrated in FIGS. 2 and 3A—3C, is schematically illustrated in more detail in FIG. 5. The state of the microelectronics art is such that printed grid patterns such as those discussed with respect to FIGS. 2 and 3A-3C can readily be prepared including leads to each of the electrodes of each individual electrode pair, and electrical address systems for selectively energizing or otherwise electrically connecting leads for individual electrode pair to an exterior source of energy or monitor are also readily available. In the system of the present invention, the area of an electrical information storage member is scanned to selectively connect an electrical pulse source externally across the two electrodes which comprise each electrode pair 17, as illustrated in FIGS. 3A-3C, and FIG. 5. In conjunction with the pulse source is a readout means which is a current detector for determining when a current actually flows between two electrodes of an electrode pair 17 while the pulse source is connected between such a pair of electrodes. Local changes in resistivity of the semiconductor film is an electrically imaged member in the inventive system are detected by the current detector. When the detector shows that a flow of current in response to an applied pulse between two electrodes of an electrode pair is greater than detected current flow responses between other electrode pairs, this is an indication that electrical information is stored in the bit of storage member surface defined by that electrode pair.

Significant current flows in response to an applied pulse will typically occur in those areas of the member containing electrical information trapped therein. This is schematically illustrated in FIG. 5, where the electrical information is indicated by the presence of charges, including charges induced in the semiconductor layer 14. The charges in semiconductor layer 14 are induced by the charges trapped in the electrically photosensitive material 12, and the charges in the semiconductor layer 14 provide a channel for the easy transport of charge carriers laterally in the semiconductor layer. The channel currents in the present invention are similar to those which occur in semiconductor layers in known MOS (metal-oxide-semiconductor) devices. It is the channel current which flows through this field induced channel which is detectable by the current detector thereby providing a signal corresponding to the information stored in an individual bit of area of the storage member. That information signal may be used in any way which may be desired. For example, corresponding information may be stored in another sort of computer storage device, or that information may be reconstructed into a visible image corresponding to the latent image, for example on a computer addressed cathode ray tube system. It is this information signal which represents the information retrieved from the storage member, and that information is retrieved without destroying the information stored in the member itself. It will of course be appreciated that due to the very small scale of the areas of volumes of materials involved in the system of a single electrode pair 17, that the channel currents being detected in the present system are of quite small magnitude, i.e. typically less than 1 milliamp or in the microamp range.

Substantially the same methods of addressing the electrical information storage member as described in conjunction with FIGS. 4A-4C and 6A-6C may be used in conjunction with the member which does not include an electrode 13. This method is illustrated in FIG. 7 wherein the function of the electrode is taken by another means of providing an electrical field across the thickness of the information storage member. In FIG. 7 electrode 13 is replaced by electrostatic charges 18 substantially uniformly provided to the top surface of the layer of substantially electrically insulating material 11 by passing a corona charging device 19 over that surface. Corona charging systems and other suitable charging systems are well known in the xerographic arts, and are further described in the aforementioned U.S. Pat. Nos. 3,580,681 and 3,801,314. Despite the absence of an electrode 13, the presence of the electricall photosensitive material 12, and the layer of semiconductive material 14, still provide the necessary effects for the member to function to store and retrieve electrical information therein. Whether the storage member includes an electrode 13 as shown in FIGS. 4A-C and 6A-C, or does not include an electrode 13 as shown in FIG. 7, the foregoing systems for addressing the storage member provide a relatively low cost storage member and system for storing binary information, and if the address system has the capability of providing differential magnitudes of address pulse inputs, the system is capable of storing electrical information corresponding to such different magnitudes, thereby providing another degree of freedom, and greatly increasing the total capacity of the storage system. Such different magnitudes of input, when stored in the storage member are the electrical equivalent of different tones or shades in a corresponding optical image.

As previously indicated the electrically photosensitive material in the storage members of the present invention is present in the form of a layer of particles of size generally less than about 1 micron, and within a range from about 0.01 to about 2.0 microns. If the electrically photosensitive material particles have, for example, a diameter of about 0.3 microns, approximately $10^9$ such particles occur in a square centimeter of surface area of the storage member. With such large numbers of potential individual information storage units, it should be clear that the size of information storage bits in the storage members of the present invention is principally limited by the state of the art of the microprinting techniques by which the electrodes 16 and electrode pairs 17, as well as their lead circuitry, are produced. For example, if electrode pairs are spaced by approximately 50 microns, and the size of the individual storage bit is therefore about 50 microns or 2 mils square, the information in the present storage members may have a resolution of about 10 lp/mm, and the storage capacity of the film would be about 7.5 million bits per square foot. However, it is known that imaging members suitable for use in the migration imaging system described in the aforementioned U.S. Pat. Nos. 3,580,681 and 3,801,314, have a resolution capacity of almost 1000 lp/mm, which is evidence that the resolution capabilities of the members of the present invention for storing electrical information is order of magnitude higher than that which can be achieved by a system including the aforementioned 50 micron square bits. This capacity necessarily contributes to the economical advantage of the present system wherein tremendous amounts of information may be stored in a very small surface area of an electrical information storage member which is itself quite economical to produce.

From this disclosure it should now be clear that electrical information corresponding to visible images can be stored in the members of the present invention at photograhic speeds. Such images are sometimes referred to as electrical latent images, and such electrical latent images can be retrieved, or read out from the storage members of the present invention, and that reading out does not necessarily destroy the latent electrical information in the storage member. Indeed the electrical information or electrical latent images stored in members of the present invention are substantially permanently stored therein, and are not destroyed, even by using the imaged or information containing members in room lighted environments, a capability which the aforementioned migration imaging members did not have. Because of the lasting quality of electrical information or latent images stored in the storage members of the present invention, additional electrical information or electrical latent images may be added to the information or images already existing in the storage member, limited only by the available surface area of the member.

The electrical information storage members of the present invention may be produced in another embodiment and used in still another fashion. As illustrated in FIG. 8, the member 10 may comprise substantially electrically insulating layer 11 containing layer of electrically photosensitive material 12 supported on substrate 15b with electrode 13 at the surface of substantially insulating layer 11 which faces substrate 15b. In this embodiment the semiconductor layer 14 comprises the exterior surface of the member opposite the substrate 15b. The storage member in FIG. 8 is particularly useful when information is to be retrieved therefrom using an electron beam system generally designated 20 in FIG. 8. Electron beam system 20 is schematically illustrated as including an electron gun 21, an accelerator screen 22, focus electrode 23 and deflector yoke 24 which are all provided with electrical leads by which they are connected to suitable electrical circuitry to operate the electron beam system. When such an electron beam scans an electrical information storage member with the electron beam impinging upon the semiconductor layer 14, the intensity of the beam is monitored by a read out coil 25 positioned near the accelerator grid 22. This system can be compared with the system illustrated in FIG. 5 by considering that when a greater current will be accepted by a certain portion of the storage member, an increase in magnitude in an electron beam which will be accepted by the storage member is an indication corresponding to information stored in that portion of the storage member illustrated in FIG. 8. In this way, the electron beam retrieves information stored in the member, and produces an electrical signal in the readout means which corresponds to that stored information. As in the case explained in conjunction with FIG. 5, once the information is retrieved through such a readout means, it may be stored for example in a computer storage system, or it may be reconstructed into a visible image corresponding to the information stored in the storage member, or used for any other suitable purpose.

Still further, the system illustrated in FIG. 8 may actually be used to address information into the storage member in a manner similar to that discussed in conjunction with FIGS. 4A–C, 5, 6A–C and 7. In the case of FIG. 8, the information is provided to the storage member in the form of an electron beam which is directed toward a portion of the member where it is desired to store certain information, and electrode 13 is at the same time appropriately biased to create an electrical field across the thickness of the member while the member is substantially uniformly irradiated with activating electromagnetic radiation, thereby allowing the electrically photosensitive material 12 to undergo its electrically photosensitive effect in those areas where a field is generated between electrode 13 and an impinging electron beam. For example, if a storage member of thickness of about 1–2 $\mu$m is used and a biasing field of about $1 \times 10^5$ V/cm to about $5 \times 10^5$ V/cm is usually used to create a latent image therein by applying a voltage of 20 to 50 volts, the surface charge density is about $1 \times 10^{11}$ e$^-$/cm$^2$ to about $5 \times 10^{11}$ e$^-$/cm$^2$, and if the area of each electrode pair cell is about $25 \times 10^{-6}$ cm$^2$, the charge per cell is about $1 \times 10^7$ e$^-$. Hence if a corresponding electron beam is focused to impinge upon an area of about 50 sq. $\mu$m, and has a current density of about 0.1 mA, the beam should remain on each electrode pair cell area for about 1/10 $\mu$sec. to provide the desired electrical input.

In this way electrical information corresponding to the information addressed to the member by the electron beam is stored in the member itself. As described with the previous systems, the member of the present invention is capable of storing not only binary information due to the presence or absence of electrical information at various bits or surface area elements of the storage member, but that information may also contain further information corresponding to the intensity and duration of the electron beam by which the information is originally addressed to the storage member.

The following examples further specifically define the electrical information storage system of the present invention. The parts and percentages are by weight unless otherwise indicated. The examples below are intended to illustrate various preferred embodiments of the novel electrical information storage system.

EXAMPLE I

An electrical information storage member according to the present invention is fabricated by microprinting about 60 mm $\times$ 60 mm (2½ in. $\times$ 2½ in.) frames of complimentary inverted L-shaped electrodes, as illustrated in FIG. 3C, onto a roll of about 70 mm wide, about 5 mil thick Mylar polyester resin available about duPont. While any suitable microprinting method may be used, one method includes first using optical reduction and photo-etching to print electrically conductive lead stripes of about 10 to 20 microns in width across the width of the film, about 16 stripes being in each millimeter thereof for a total of about 1000 stripes per 60 mm frame. Next a thin Mylar i.e. about 0.5 mil thick, film is perforated in rows of extremely small holes, i.e. about 0.2 mil diameter, and in a pattern which matches the aforementioned printed stripes, on the thicker Mylar, except that the thin Mylar is about 60 mm wide, and the holes therein are at intervals of 16 holes per mm, or about 1000 holes per row across the 60 mm wide film. Any other suitable method may be used to produce such holes, and one such method includes automatically punching those holes by the use of a pulsating and oscillating laser beam which instantaneously melts away the Mylar. The perforated thin film is then laminated onto the printed thicker film in such a way that the rows of holes match the stripes printed onto the thicker film. One way of achieving this matching is to do it automatically by optical reference point adjustment using a laser beam. After lamination the more narrow and thin film surface is printed with rows of electrically conductive stripes extending in directions perpendicular to the stripes on the thicker Mylar, and formed into L-shaped electrode patterns, wherein one of each complimentary pair of L-shaped electrodes is electrically connected to the stripes on a thicker Mylar film thereby providing separate electrical contacts for each of the electrodes of any complimentary pair of L-shaped electrodes in the system. The 60 mm × 60 mm frames of micro-printed electrode pairs include about one million, 50 micron × 50 micron cells, each surrounded by a pair of complimentary, relatively inverted, L-shaped electrodes.

A semiconductor film is then deposited over the micro-printed array of electrodes to a thickness of more than about 500 Angstroms by vacuum depositing silicon thereon in a vacuum atmosphere wherein a source of silicon is bombarded by an electron beam, and a vacuum is maintained at about $10^{-6}$ Torr in order to avoid oxidation of the deposited semiconductor. The deposition of the semiconductor material can be made continuously along the entire strip of film being fabricated in order to cover all frames on the strip in one continuous operation.

The semiconductor coated micro-printed film is then coated with an about 0.5 to 1 micron thick film of substantially electrically insulating thermoplastic material comprising an 80/20 hexylmethacrylate/polystyrene copolymer (Tg of about 55° C) which is roller coated over the semiconductor layer and then oven dried in a partial vacuum.

A layer of electrically photosensitive material is then vacuum evaporated into a substantially monolayer configuration near the upper surface of the layer of substantially electrically insulating thermoplastic material, this particulate layer of electrically photosensitive material comprising amorphous selenium vacuum evaporated by the technique disclosed in U.S. Pat. No. 3,598,644. The particles of electrically photosensitive selenium in the monolayer are of size of about 0.1 to about 0.5 microns in diameter.

Thereafter a partially transparent conductive electrode film of aluminum of thickness of about 500 Angstroms is continuously deposited on the upper surface to complete an image storage member having a cross section like that illustrated in FIG. 2. The aluminum electrode can be vacuum evaporated onto the member in the same apparatus for vacuum evaporating the selenium as described in the previous step. The resultant electrode layer will allow optical transmission of visible light to an extent of about 50%, but is continuously electrically conductive.

EXAMPLE II

Electrical information storage members made according to Example I have information recorded thereon by photo-electrical means, and subsequently retrieved therefrom, as follows. A film containing the about 60 mm × 60 mm frames of microprinted electron pairs overcoated with the other elements of the inventive electrical information storage members is loaded into a camera apparatus similar to that described in Blackert U.S. Pat. No. 3,528,355 wherein the framing device for locating a frame of film to be exposed therein is provided with X and Y arrays of contact points which make contact with corresponding leads to the printed circuit micro-electrodes in the storage member when the storage member is positioned therein. The contact points are electrically connected with a solid-state switching device, and when images are to be selectively addressed to the film by photographic means, all of the pairs of electrodes are connected together by the solid-state switching device and a positive voltage in the range of about 10 to about 50 volts is applied thereto, while the aluminum electrode of the storage member is grounded. The shutter of the camera is opened for an instant to imagewise expose the film with light intensity which in various areas may range from about 0.1 to about 100 milliergs/cm$^2$ sec. For the storage member wherein the electrically photosensitive material comprises selenium, blue light exposure is particularly preferred, and is often a substantial component of the output of CRT displays which may be recorded by the present system. After exposure, the applied bias voltage is disconnected, and the film advanced until the next frame is placed with its electrode leads in contact with the contact points in the camera apparatus. The exposed frame of film exhibits no visible image, and after the bias voltage is removed from all electrodes may be grounded and thereafter the film retains no photographic sensitivity until it is again biased.

The same apparatus may be used for addressing information into the storage member by electrical techniques rather than photographic or optical techniques, by placing the desired frame of the film in the framing device of the camera apparatus with its electrical leads in contact with the contact points in the camera apparatus. The electrical information is addressed into each individual cell by applying a pulsed positive bias voltage of magnitude of about 30 volts to both of the electrodes of each pair, while the aluminum electrode on the top surface of the storage member is grounded, and while the shutter is opened exposing the entire surface of the frame of the storage member to light energy of about $10^{-2}$ milliergs/cm$^2$sec. In this way electrical information is addressed into the particular area controlled by the electrodes through which the bias is applied. When the shutter is closed and the film advanced, the storage member contains information in each of the areas of the member where the electrode pairs were so biased. Once again the film exhibits no visible image and after grounding retains no photographic sensitivity until again biased. The film can be stored in a room environment, or for even longer life can be stored in a sealed container.

Information stored in a member by either the primarily photographic means, or the primarily electrical means, described above, is retrieved by placing the film back in the camera apparatus, ensuring that the electrode leads in contact points in the frame portion of the camera apparatus are properly registered and maintaining the shutter in closed position. The solid state switching device is then used to send voltage pulses between each of the pairs of electrodes in each bit of the frame area. A test pulse of magnitude of several volts is applied between the two electrodes for a very short duration, i.e. about a few tens of nanoseconds ($10^{-8}$sec), when using these members where the semiconductor layer comprises a few hundred Angstroms of silicon. The pulse current across a 1 Kohm resistor in series in the circuit across the two electrodes of the pair produces a signal which is typically on the order of about 1 millivolt where no information is in the bit of the storage member, to several hundred millivolts for a bit of the storage member which is fully charged with electrical information. The signals resultant from the foregoing detection system are fed into a pulse-analyzer, the output of which may be displayed or transmitted, or compared with specific information stored elsewhere. The total access time to the information stored in each frame of film is on the order of a few milliseconds.

Thus it is seen that by using the address and retrieval systems of the present invention, it is possible to obtain an exact duplicate of any particular frame by retrieving the information therefrom and recording the same information onto a second film by one of the methods of the present invention. Furthermore, the information so retrieved is not erased from its original storage member in the process, and it is possible to duplicate only a portion of a total frame of information, thereby selectively omitting certain portions of the total picture or information in a single frame by deliberately supressing the output voltage pulses of cells in those areas where the information is to be omitted. In this way it is possible to obtain a copy of the information or image in a frame with effectively erased portions thereof. This technique may be useful in segmenting or combining various composite arrays of photographic information or other data.

EXAMPLE III

Where the electrical information storage member is to be used in an electron beam address and retrieval system, the microprinting of paired electrodes and their lead stripes as described in Example I above, is unnecessary. In this case, the semiconductor film may simply be vacuum deposited on a layer of readily soluble material, such as gelatin, whereupon the layer of substantially electrically insulating thermoplastic material is overcoated, and the monolayer of amorphous selenium particles vacuum evaporated therein, all as described in Example I. The surface of the film into which the selenium particles were vacuum evaporated is then laminated to an aluminized Mylar surface, the aluminum of which corresponds to electrode 13, and the Mylar substrate of which corresponds to layer 15$b$, as shown in FIG. 8. The aluminized Mylar substrate is sufficiently transparent to light for the purposes of this invention. The soluble material upon which the semiconductor film was first formed is then dissolved, in this case by dissolving the gelatin film with water.

Information is then addressed into the storage member by mounting the storage member in a chamber which can be evacuated. The chamber is also equipped with electron beam system similar to that illustrated in FIG. 8. Alternatively, rather than mounting the film in a vacuum chamber, the semiconductor surface of the film may be placed tightly on the window of a special electron beam generating cathode ray tube which has a suitable front window, comprising for example a thin strip of beryllium metal or a fiber optic plate through either of which the electron beam may still effectively address the storage member. For example, where the relatively low density beryllium metal plate is used, a 25 KeV electron beam can penetrate about 5 microns (0.2 mil), and a 40 KeV electron beam can penetrate about 12.5 microns (0.5 mil).

Regardless of whether the vacuum chamber or special CRT system are used, the electron beam is used to write information in the form of negative charges in the semiconductor surface of the storage member, and when the storage member is uniformly illuminated with activating electromagnetic radiation, the storage member traps an electrical latent image therein due to the local electrical fields generated by the charges placed on the semiconductor by the electron beam. If the members in use in this example where the layer of substantially electrically insulating thermoplastic material is about 1 micron thick, it is typically necessary to develop a local field of 20 to 50 volts across the film thickness in order to electrically latently image the member. Such fields typically require surface charge densities of about $5 \times 10^{11}$ electrons per $cm^2$. Where the electron beam can be focused to an area of about 10 microns in diameter, which would correspond to a resolution of about 50 lp/mm, and operated at a total electron flux of about 100 microamperes, the electron beam may be scanned at a rate up to about 10 microseconds per centimeter, while still providing the desired surface charge density to the member. Where the electron beam must also traverse a window on the front of a special CRT tube, the writing speed is a few orders of magnitude slower because of the attenuation of the electron density by the window.

In addition to selectively addressing individual portions of the area of the storage member of the present invention, the electron beam system may also be used in conjunction with a photographic address system. In this case the storage member and the electron beam system are kept in a dark atmosphere, and electron beam system is used to uniformly scan the surface of the film to charge the semiconductor layer. In this mode it is good practice to not sharply focus the beam so that the scanning lines are not well defined and charging is more uniform. At the moment of charging, which typically can be completed in less than 1 millisecond, the film is exposed to the desired light image through the aluminized Mylar substrate side thereof, thereby causing the electrically photosensitive selenium particles to undergo their electrically photosensitive effect trapping an electrical latent image in the storage member.

The images placed on a storage member by any of the foregoing means are retrieved by again placing the imaged storage member in a vacuum chamber or against the window of the special CRT tube electron beam system, and a low intensity, tightly focused electron beam is used to scan the semiconductor surface thereof. The electron gun is operated at low anode voltage, for example, less than 1 Kv. The electron beam intensity variation is monitored with a small grid coil as shown in FIG. 8, and the differences in intensity monitored by the grid coil produce a signal which corresponds to the information and magnitude thereof stored in the particular portion of the storage member upon which the scanning electron beam is momentarily focused. The location of the electron beam on the storage member is synchronized with the signal from the grid coil detector by synchronizing means like those used in common television receivers, which operate from the deflection yoke of the electron gun.

Although specific components, proportions and arrangements of elements have been stated in the above description of preferred embodiments of this invention, other equivalent components and arrangements of elements may be used with satisfactory results and various degrees of quality, or other modifications may be made herein to synergize or enhance the construction of the invention to thereby increase its utility. It will be understood that such changes of details, materials, arrangements of parts, and uses of the invention described and illustrated herein, are intended to be included within the principles and scope of the claimed invention.

What is claimed is:

1. An electrical information storage member, comprising:
   a layer of substantially electrically insulating material containing a layer of particulate electrically photoconductive material;
   a layer of semiconductor material contacting one surface of the insulating layer, the semiconductor material having a resistivity of from about 500 to about 2,000 ohm-cm;
   an electrode layer of a substantially transparent electrically conductive material contacting the opposite surface of the layer of insulating material; and
   a plurality of electrode pairs contacting the semiconductor material on the side opposite the insulating layer.

2. The member of claim 1, additionally comprising a substrate contacting said electrode layer.

3. The member of claim 1, additionally comprising a substrate contacting said plurality of electrode pairs.

4. The member of claim 1, wherein said layer of substantially electrically insulating material is of a thickness in the range of up to about 4 microns, and said particulate electrically photosensitive material is of particle size in the range of about 0.01 to about 2.0 microns.

5. The member of claim 1, wherein said semiconductor layer is of a thickness not greater than about 1 micron.

6. The member of claim 1, wherein the distance between the two electrodes comprising each of said electrode pairs, is not greater than about 100 microns.

7. A method of addressing electrical information into an electrical information storage member, comprising:
   providing an electrical information storage member according to claim 1,
   addressing electrical information into desired areas of said member by coincidentally placing an electrical field between the transparent electrode and the plurality of electrode pairs and exposing said electrically photosensitive material with activating electromagnetic radiation, at least in said desired areas.

8. The method of claimm 7, wherein said electrical field is substantially uniform throughout the entire area of said member, and only said desired areas are exposed with activating electromagnetic radiation.

9. The method of clam 7, wherein the entire area of said member is exposed with activating electromagnetic radiation, and only said desired areas have an electrical field between the transparent electrode and the plurality of electrode pairs.

10. A method of addressing electrical information into an electrical information storage member, comprising:
   providing an electrical information storage member according to claim 1,
   impinging an electron beam onto the surface of the semiconductor layer and scanning said impinging electron beam throughout the area of the semiconductor layer, thereby substantially uniformly negatively charging the semiconductor surface, and
   exposing desired areas of said electrically photosensitive material with activating electromagnetic radiation, thereby addressing electrical information into said desired areas of said member.

* * * * *